United States Patent [19]

Dervisoglu et al.

[11] Patent Number: 5,068,881
[45] Date of Patent: Nov. 26, 1991

[54] SCANNABLE REGISTER WITH DELAY TEST CAPABILITY

[75] Inventors: Bulent I. Dervisoglu, Framingham, Mass.; Gayvin E. Stong, Fort Collins, Colo.

[73] Assignee: Hewlett-Packard Company, Palo Alto, Calif.

[21] Appl. No.: 565,345

[22] Filed: Aug. 10, 1990

[51] Int. Cl.$^5$ .......................... G11C 5/06; G06F 13/00
[52] U.S. Cl. .......................... 377/70; 365/73; 365/78; 365/154; 365/230.08; 364/716
[58] Field of Search .......................... 377/70; 364/716; 365/73, 78, 154, 189.05, 230.08

[56] References Cited

U.S. PATENT DOCUMENTS

| | | | |
|---|---|---|---|
| 4,293,919 | 10/1981 | Dasgupta et al. | 364/716 |
| 4,495,629 | 1/1985 | Zasio et al. | 377/70 |
| 4,782,283 | 11/1988 | Zasio | 377/70 |
| 4,922,457 | 5/1990 | Mizukami | 365/73 |

OTHER PUBLICATIONS

"A Logic Design Structure for LSI Testability", E. B. Eichelberger and T. W. Williams, Proceedings of the 14th Annual Design Automotion Conference, Jun., 1977, pp. 462–468.

"Testing for Timing Faults in Synchronous Sequential Integrated Circuits", Yashwant K. Malaiya and Ramesh Narayanaswamy, pp. 560–571, Proceedings of the 1983 International Test Conference (IEEE).

Primary Examiner—John S. Heyman
Attorney, Agent, or Firm—Guy J. Kelley

[57] ABSTRACT

A scan-register having first and second data input ports (SYS_DATA, SCAN_IN), a data output port, and inputs for at least first, second, third, and fourth control signals (SYS_CLK, M_LOAD, CLK_B, CLK_A).

The scan-register comprises the following elements: first means (12A) having inputs coupled to the first and second data input ports for selectively storing data appearing on one of the said data input ports in accordance with the occurrence of a predefined combination of states of at least the first and second control signals; second menas (10A) having at least one input coupled to the second data input port for selectively storing data appearing on the second data input port in accordance with the occurrence of a predefined state of at least the third control signal; and third means (12B) having at least one input port coupled to an output of one of the first and second means, and further having an output coupled to the data output port, for selectively storing data stored in either the first or second means in accordance with the occurrence of a predefined state of at least the fourth control signal and providing the data stored therein to the data output port.

The data appearing on one of the first and second data input ports is therefore sequentially shiftable through selected ones of the first, second and third means, to the output port in accordance with the occurrence of predefined sequences of the predefined states of selected ones of the control signals.

26 Claims, 9 Drawing Sheets

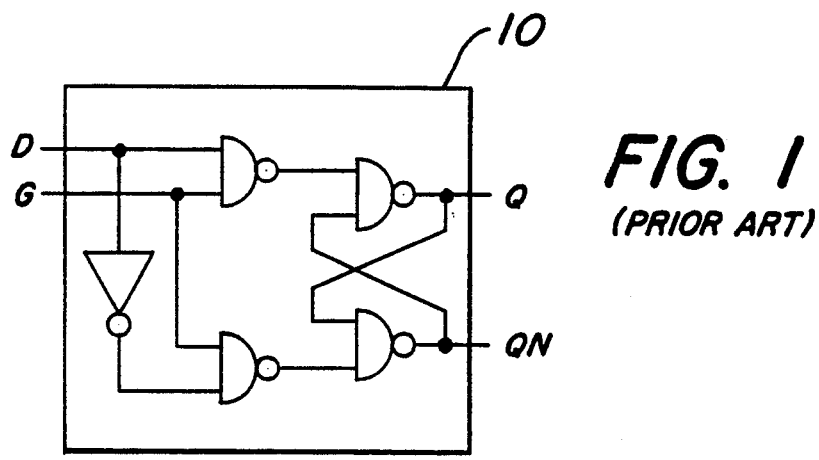
FIG. 1
(PRIOR ART)
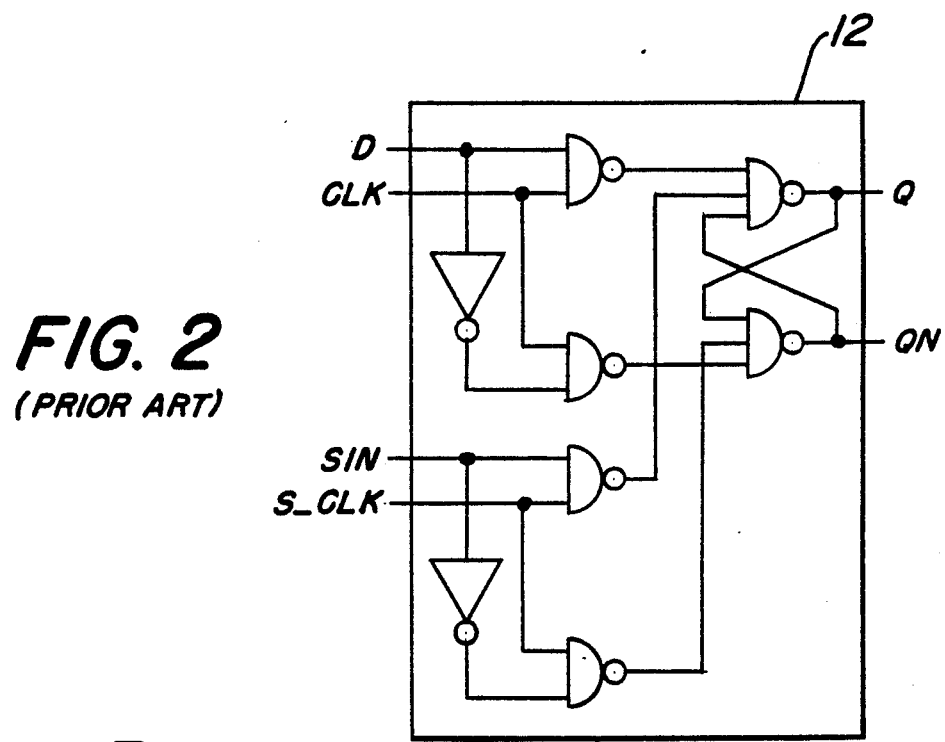
FIG. 2
(PRIOR ART)
FIG. 3
(PRIOR ART)
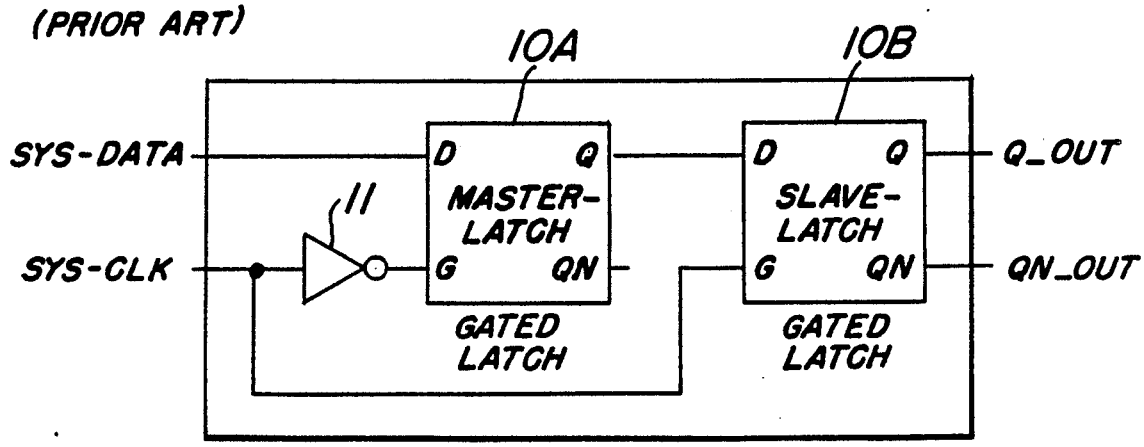

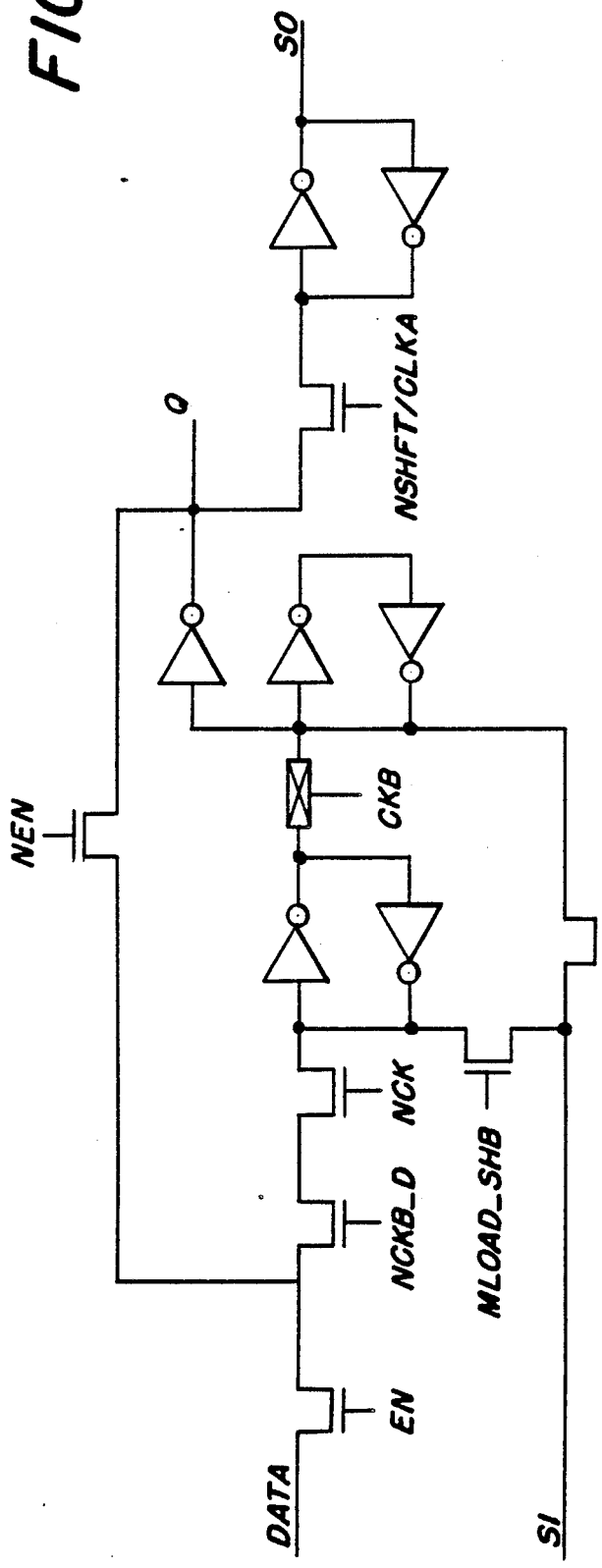
FIG. 10
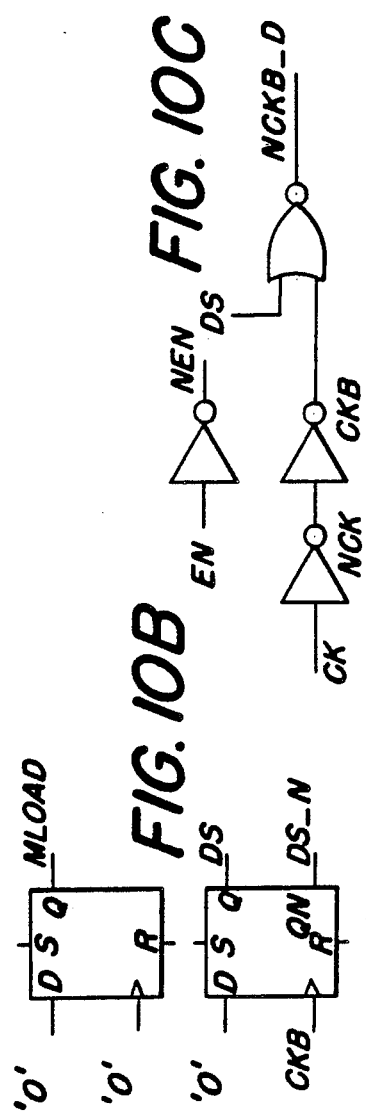
FIG. 10B
FIG. 10C
FIG. 10D
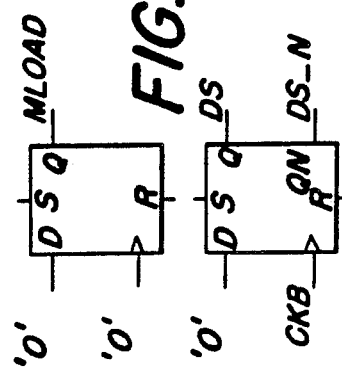
FIG. 10A FUNCTIONAL TRUTH TABLE FOR "SCAN-REGISTER
WITH MASTER-LOAD AND DOUBLE-INVERSION" 20

| SYS_CLK | ENABLE | SYS_DATA | CLK_A | CLK_B | SCAN_IN | D_STRB | M_LOAD | Q_OUT | QN_OUT | SCAN_OUT |
|---|---|---|---|---|---|---|---|---|---|---|
| L | X | X | L | L | X | L | L | Q | QN | SO |
| P | L | L | L | L | X | L | L | Q | QN | SO |
| P | H | H | H | L | X | L | L | L | H | SO |
| P | H | H | X | H | X | L | L | H | L | SO |
| L | X | X | L | L | X | L | L | Q | QN | QN |
| L | X | X | H | L | L | L | L | H | L | SO |
| L | X | X | L | H | H | L | L | L | H | SO |
| L | X | X | H | H | L | L | L | L | H | H |
| L | X | X | H | H | H | L | L | H | L | L |

D_STRB AND M_LOAD AFFECT THE BEHAVIOR OF THE MASTER LATCH, AS FOLLOWS:

| D_STRB | M_LOAD | SCAN_IN | MASTER_Q_OUT |
|---|---|---|---|
| H | L | X | MASTER_Q_OUT |
| H | H | L | L |
| H | H | H | H |

(P = HIGH GOING PULSE OR RISING EDGE)

FIG. 11

SCANNABLE REGISTER WITH DELAY TEST CAPABILITY

FIELD OF THE INVENTION

The present invention relates to the field of scannable latches. More particularly, the invention relates to scannable latches designed to facilitate scan delay testing.

BACKGROUND OF THE INVENTION

The central processing unit (CPU) of a large computer system basically consists of memory elements, combinational logic, and a clocking system. The memory elements are arranged in sets, sometimes called registers, corresponding to the word size used within the computer system. Between the sets of memory elements are combinational logic circuits.

At the end of a clock cycle, which is also the beginning of the next clock cycle, data on the output of the combinational logic circuitry is stored in a first set of memory elements. This data appears on the output of the set of memory elements, and therefore on the input of other combinational logic circuitry connected to the outputs of the first set of memory elements. This other logic circuitry performs the designed logic function on the data, and at the end of the clock cycle the output of this combinational logic is stored in a next set of memory elements, at least some of which may include a set of latches that provide input to the logic circuitry. This process is repeated as the computer system operates; that is, data is processed by combinational logic circuitry, stored, passed on to the next set of combinational logic circuitry, processed, stored, and so on.

One of the features that is employed in large computer systems today is a "scannable latch." A scannable latch includes a latch that can be converted to a stage of a shift register by the use of appropriate clock signals. The scannable latch allows the contents of the resulting shift register to be "scanned" by shifting out the contents for examination. The shift register, and therefore the latch, can also be loaded with new contents by shifting in new data. See, for example, U.S. Pat. No. 4,495,629. Circuitry for testing for timing faults in synchronous sequential circuits are also disclosed and discussed in Malaiya, Y.K. and Narayanaswamy, R., "Testing for Timing Faults in Synchronous Sequential Integrated Circuits," Paper 19.3, pp. 560-571, 1983 International Test Conference (CH19331/83/0000/0560$0100 IEEE). The advantages offered over these by the present invention include flexibility, ease of use and simple construction.

FIG. 1 depicts a known "gated-latch" circuit 10 in which the gated-latch output Q follows (i.e. is set to the same value as) the data input D while the gate signal G is "high" (i.e., at the logic high level). When gate signal G changes to "low", any further changes to Q are prevented, and Q retains its most recent value, even if D changes. The complementary gated-latch output QN is always set to the opposite of the Q output value.

FIG. 2 depicts a known "gated-latch with dual ports" circuit 12 in which the gated-latch output Q follows the first port data input D, or the second port data input SIN, depending upon whether the first port gate signal CLK or the second port gate signal S_CLK is high. The output Q is prevented from any further changes when both CLK and S_CLK are low, even if D or SIN changes. The complementary gated-latch output QN is always set to the opposite of Q. If both CLK and S_CLK are high while D and SIN have opposite values, the latch outputs Q and QN will both be high.

FIG. 3 depicts a "master-slave" register circuit comprising first gated-latch 10A, second gated-latch 10B, and inverter 11 which inverts the gate signal SYS_CLK connected to gated-latch 10A. It is customary to refer to gated-latch 10A as the "master latch," and gated-latch 10B as the "slave latch."

When SYS_CLK is low, the gate signal G to master latch 10A is high, which enables master latch output Q to follow the SYS_DATA input. During this time (i.e., while SYS_CLK is low), the gate signal G to slave latch 10B is low, which prevents the slave latch 10B output Q from changing. When SYS_CLK changes to the logic high level, the master latch 10A gate signal G goes to logic low, which prevents any further changes at the master latch Q output, even if the master latch data input D (which is connected to SYS_DATA) changes. During this time (i.e. when SYS_CLK is high), the gate signal to slave latch 10B is high, which enables the slave latch Q output to take on the same value as the master latch Q output. The slave latch output Q is thus allowed to change only once per clock cycle in response to SYS_CLK changing from low to high. When SYS_CLK changes from low to high, the slave latch Q output is set to the value of the SYS_DATA input immediately prior to SYS_CLK going high.

Previous scannable register designs focused on functional test problems. See, e.g., "Eichelberger, E.B. and Williams, T.W., "A Logic Design Structure for LSI Testability", *Journal of Design Automation and Fault Tolerant Computing*, May 1978, pp. 165-178. The present invention addresses the problem of testing the delay associated with particular paths. Whereas special process test devices can be used to test whether a particular device can be operated at a particular speed, defects and variations across the chip or wafer are not detected by such devices. Applying test vectors at speed to the pins of a chip provides some delay test coverage, but it is difficult to generate the required vectors for specific paths inside the chip.

Accordingly, it is an object of the present invention to provide means for facilitating delay path testing between any two scannable registers. It is a further object of the present invention to provide a scannable register in which two different values can be stored in the scan register, the second value being transferred to the register's output on a rising clock edge, propagating through the combinational logic (i.e., the delay path), and being captured in a scannable register on the next rising clock edge. In addition, another object of the present invention is to provide a scannable register in which initial values are loaded into a slave-latch portion of the scannable register, while values which are to replace them are loaded into a master-latch portion of the same register. Special test signals should be provided which allow these two values to be loaded into the register. These special test signals should also provide means for triggering the transfer of data values from the master-latch to the slave-latch, through the delay path, and into a register. Path delays in excess of the time delay between the rising edges of the two clock pulses should be exposed. The present invention achieves these goals.

SUMMARY OF THE INVENTION

The present invention achieves the stated objectives by providing a "scan-register with master-load" (or "scan-register").

A scan-register according to the invention comprises at least two data input ports, at least one data output port, and inputs for at least first, second, third and fourth control signals. Within the scan-register, a first means, having inputs coupled to data input ports, selectively stores data appearing thereon in accordance with the occurrence of a predefined combination of states of the first and second control signals. Second means selectively stores data appearing on the second data input port in accordance with the occurrence of a predefined state of the third control signal, and third means, having at least one input coupled to an output of at least the first or second means, and further having an output coupled to the data output port, selectively stores data stored in the first and second means in accordance with the occurrence of a predefined state of the fourth control signal. The data stored in the third means is provided to the data output port.

According to the invention, the data appearing on either of the data input ports is sequentially shiftable through selected ones of the first, second and third means. The data is shifted from the selected input port to the output port in accordance with the occurrence of predefined sequences of the predefined states of the control signals.

According to a first preferred embodiment of the invention, a first mode of operation may be selected in accordance with a first predefined sequence of predefined states of the control signals. In this mode, data is sequentially shiftable from either the first or second data input ports, through the first and third means to the data output port while different data is stored in the second means. A second mode of operation may be selected in accordance with a second predefined sequence of predefined states of the control signals. According to this second mode of operation, data is sequentially shiftable from the second data input port, through the second and third means to the output data port while different data is stored in the first means.

In the first mode of operation of the first preferred embodiment, data is shifted from the first data input port to the data output port in response to sequential predefined states of the first control signal. In addition, data is shifted from the second data input port to the data output port in response to a predefined state of the second control signal followed by a predefined state of the first control signal.

In the second mode of operation of the first preferred embodiment, data is shifted from the second data input port, directly through only the second means and third means to the data output port in response to a predefined state of the third control signal followed by a predefined state of the fourth control signal.

Other preferred embodiments and modes of operation are described in detail below.

BRIEF DESCRIPTION OF THE DRAWINGS

FIG. 1 is a block diagram of a prior art "gated-latch" circuit.

FIG. 2 is a block diagram of a prior art "gated-latch with dual ports" circuit.

FIG. 3 is a block diagram of a prior art "masterslave" register circuit.

FIG. 10 is a schematic representation of the circuit of FIG. 8, as implemented in CMOS and incorporating an ENABLE function.

FIGS. 10A, 10B, 10C and 10D illustrate how the various control signals used in FIG. 10 are derived.

FIG. 11 is a tabular description of the behavior of the circuit of FIG. 8.

DETAILED DESCRIPTION OF THE PREFERRED EMBODIMENT

Figure 4:
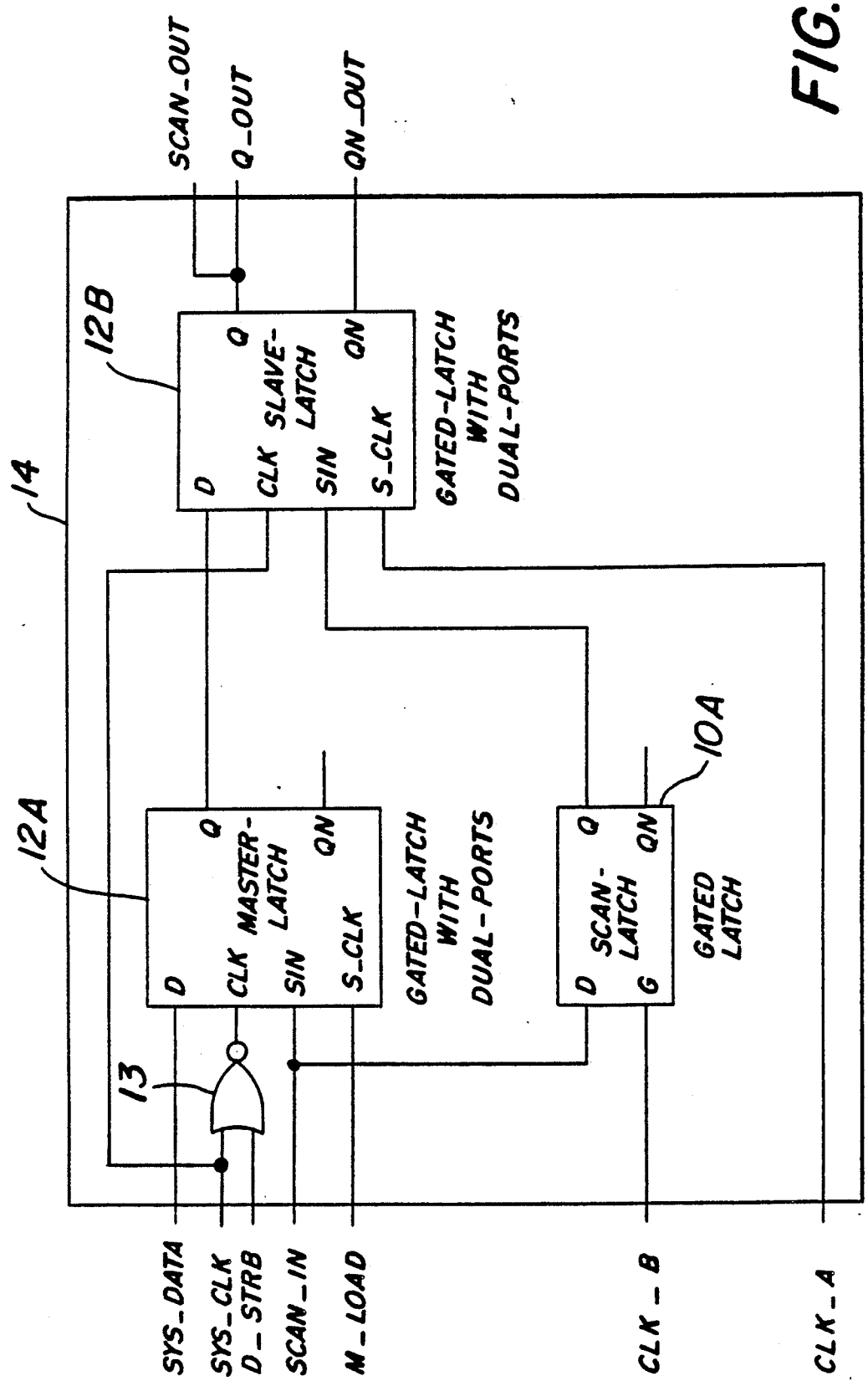
FIG. 4 is a block diagram of a "scan-register with master-load" circuit according to the present invention.

Preferred embodiments of the invention will now be described with reference to FIGS. 4–10, wherein like reference numerals designate like elements FIG. 4 depicts a first preferred embodiment of the present invention. This embodiment is referred to herein as "scan-register with master-load," and comprises master-latch 12A, slave-latch 12B, scan-latch 10A and NOR gate 13.

Figure 6:
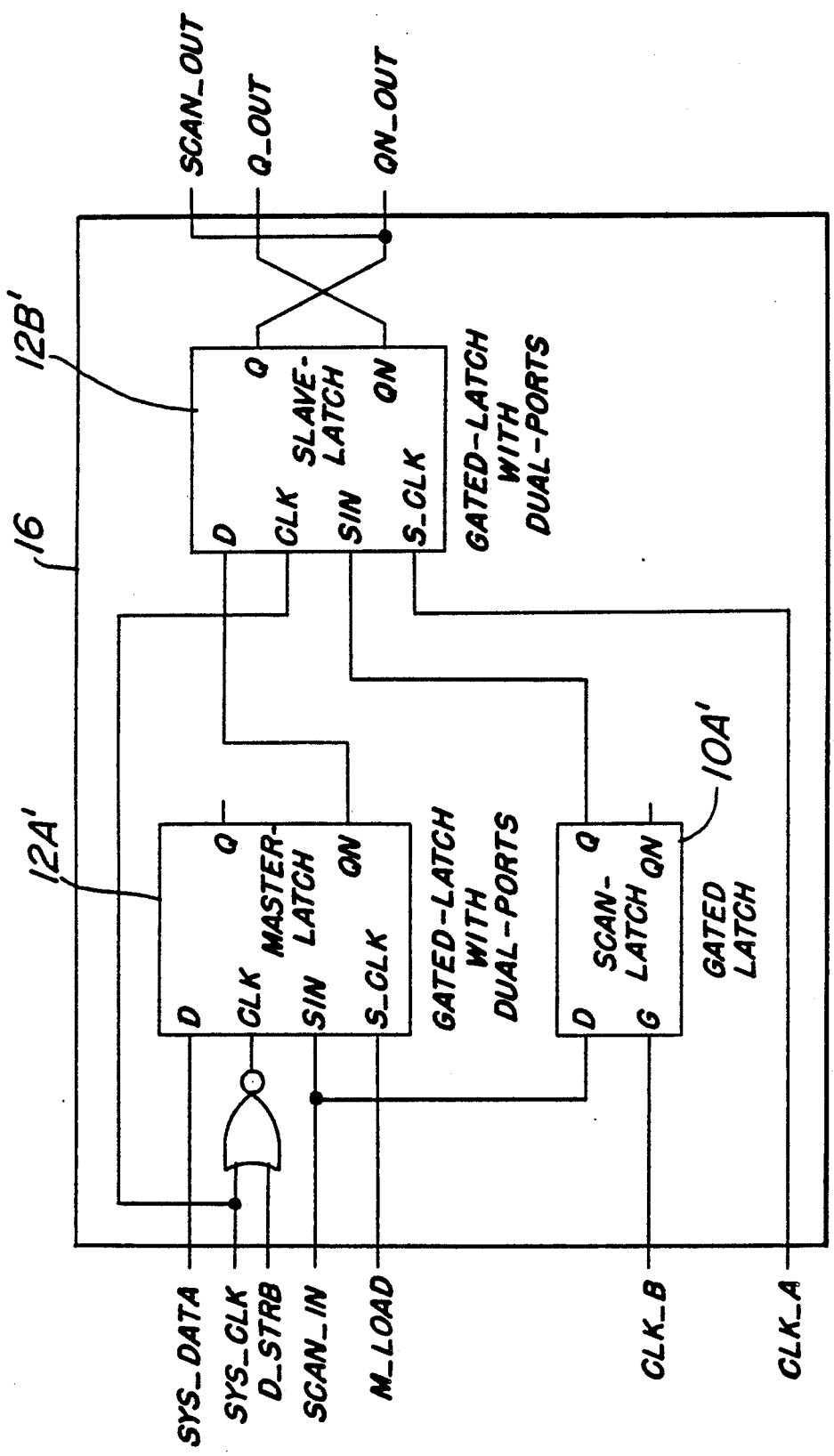
FIG. 6 is a block diagram of an alternative embodiment of the circuit of FIG. 4.

The operation of the embodiments of FIGS. 4 and 6 will now be summarized. Reference is made to FIG. 4, but the operation of the embodiment of FIG. 6 is virtually identical. (Any differences will be readily apparent from the description of FIG. 6.)

There are two modes of operation. The first mode of operation is selected in accordance with a first predefined sequence of predefined states of particular clock signals. The clock signals are essentially control signals, since they control the operation of the device. In this first mode of operation data is sequentially shifted from the "SYS_DATA" or "SCAN_IN" data input ports, through master latch 12A and slave latch 12B to the output data port (i.e., "Q_OUT") while different data is stored in scan-latch 10A.

According to the first mode of operation, data is shifted from the SYS_DATA input port to the Q_OUT output port in response to sequential occurrences of rising edges of the SYS_CLK signal. Data is shifted from the SCAN_IN input port to the Q_OUT output port in response to a high going pulse of the M_LOAD signal followed by a high going pulse of the SYS_CLK signal.

The second mode of operation is selected in accordance with a second predefined sequence of predefined states of the control signals. According to this mode of operation, data is sequentially shifted from the SCAN_IN data input port, through scan-latch 10A and slave latch 12B to the SCAN_OUT data port while different data is stored in master latch 12A.

During this second mode of operation, data is shifted from the SCAN_IN input port, directly through only scan-latch 10A and slave latch 12B to the SCAN_OUT output port in response to a high going pulse of the CLK_B signal followed by a high going pulse of the CLK_A signal.

The circuit of FIG. 4 will now be described in detail.

Master-latch 12A and slave-latch 12B are each a gated-latch with dual ports circuit, and scan-latch 10A is a gated-latch, each of which is described above in the Background of the Invention section. When the three signals M_LOAD, D_STRB and SYS_CLK are all low, master-latch 12A's output Q follows the SYS_DATA input. The Q output of master-latch 12A moves to the Q output of slave-latch 12B (which is also the Q_OUT output of the overall scan-register with master-load circuit 14) by keeping CLK_A low while SYS_CLK is changed from low to high. This causes the master-latch/slave-latch pair to behave like the master-slave register circuit depicted in, and described above with reference to, FIG. 3.

Scan-latch 10A can be operated separately such that when CLK_B is set high, the scan-latch output Q follows SCAN_IN. When CLK_B is changed to low, the most recent value of the scan-latch 10A output Q is preserved, even if SCAN_IN changes. The value from the Q output of scan-latch 10A can be transferred to the Q output of slave-latch 12B by keeping CLK_B low while the CLK_A signal to slave latch 12B is high, provided that SYS_CLK is low.

M_LOAD is used as the gate signal for the second port of master-latch 12A. With either SYS_CLK or D_STRB set high, the master latch 12A output Q will follow the SCAN_IN value when M_LOAD is set high. D_STRB is used as a disable signal for the SYS_CLK signal going into master-latch 12A. When D_STRB is set high, the gate signal CLK on the first port of master-latch 12A will be low, and master-latch 12A will be immune to changes to SYS_DATA and SYS_CLK.

Noteworthy features of scan-register with master-load circuit 14 include: Firstly, the ability to prevent master-latch 12A's Q output from changing prior to slave-latch 12B being loaded from master-latch 12A when SYS_CLK changes from low to high. This is accomplished by keeping D_STRB high. Secondly, the ability to set master-latch 12A's Q output from a data input source (i.e., SCAN_IN) which is different from the system data input (SYS_DATA).

These two features make it possible to cause a transition at the Q_OUT output to any desired value (which includes the complement of its present value), with the changing of SYS_CLK from low to high, by loading the desired value into master-latch 12A's Q output, using the SCAN_IN and M_LOAD signals, and holding D_STRB high. Without the D_STRB signal, the value loaded into master-latch 12A's Q output would be subject to change if SYS_DATA were to change before SYS_CLK is set high.

Scan-registers 14 of the type just described would typically be used in a digital system for implementing that system's internal state variables. In addition, the individual scan-registers 14 would be connected to each other in such a way that the SCAN_OUT output signal from scan-register "i" would be connected to the SCAN_IN input of scan-register "i+1", thereby forming a chain of scan-registers collectively referred to as a "scan-path".

Figure 5:
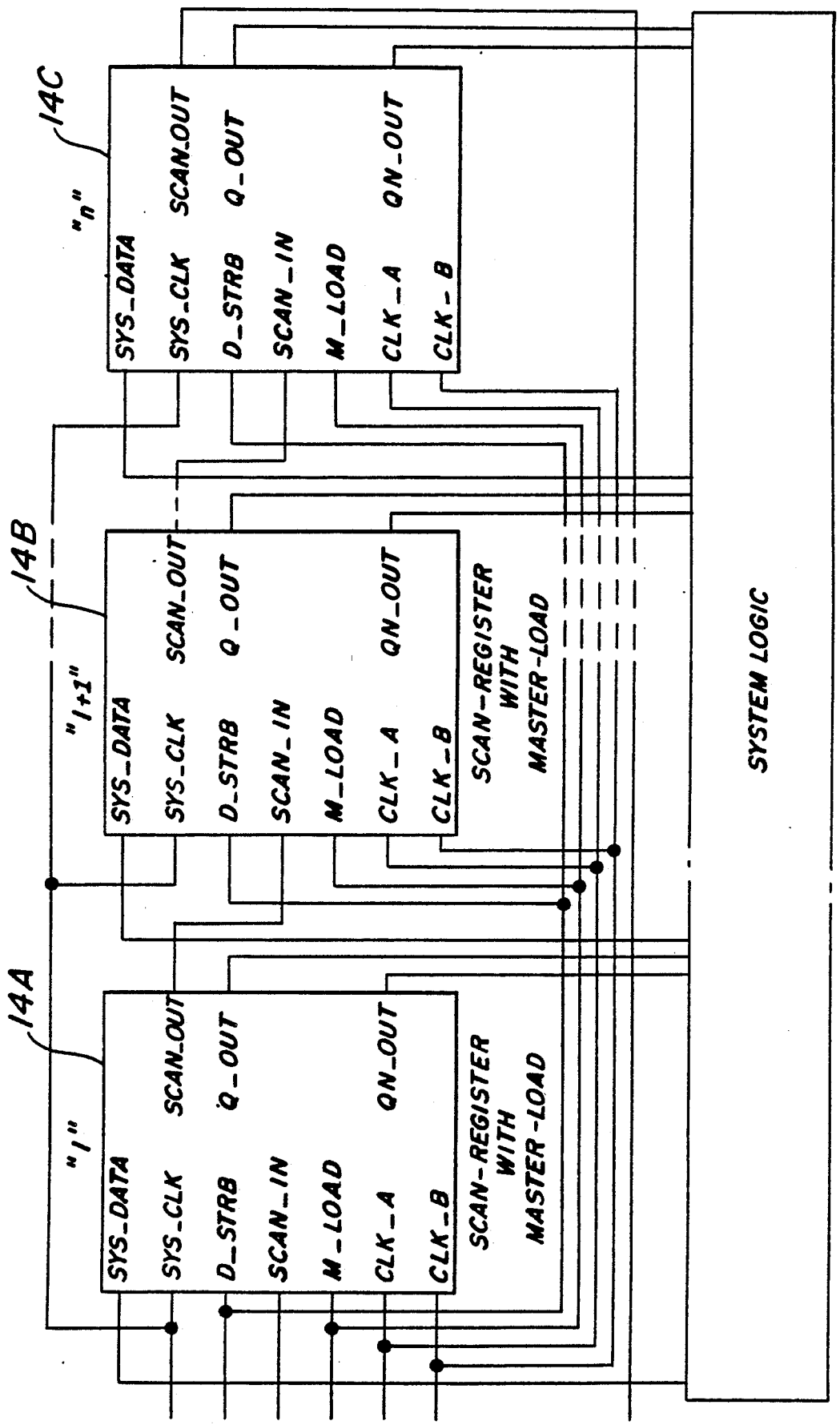
FIG. 5 is a block diagram of a scan-path in accordance with the present invention.

Referring now to FIG. 5, SCAN_IN for first scan-register 14A (scan-register with the lowest ordinal number "i") and SCAN_OUT from the last scan-register 14C (scan-register with the highest ordinal number "i") along the chain would be connected to separate SCAN_INPUT and SCAN_OUTPUT pins of the overall integrated circuit in which the scan path is implemented. All scan-registers would share the CLK_A, CLK_B, D_STRB and the M_LOAD signals. In this way, master-latch sections 12A of individual scan-register circuits 14A, 14B, etc. can be set to predetermined values by setting D_STRB and M_LOAD high, SYS_CLK low, and using alternate (non-overlapping) CLK_A and CLK_B signals in concert with the SCAN_IN signal to the overall integrated circuit. The desired values are presented on the SCAN_IN terminal in the same order as the destination scan-registers are interconnected along the scan-path. The serial shifting-in of the predetermined values into scan-registers 14A, 14B, 14C, etc., is referred to as the "scan in" action. Once this is done, the M_LOAD signal would be set low, and while D_STRB is kept high another round of scan in would be performed to set the respective slave-latches 12B.

During the second scan in, the master-latch 12A sections of scan-registers 14A, 14B, etc. would not be changed since M_LOAD is low and D_STRB is high. At this stage, two successive SYS_CLK pulses would be applied to the entire circuit and D_STRB would be changed to logic low in between the two SYS_CLK low to high transitions. This can be achieved by using a separate latch or pair of latches to provide the D_STRB signal such that this latch (or pair of latches) is reset (that is D_STRB is set to low) following the rising edge of SYS_CLK. For correct operation the new value of D_STRB following the first rising edge of SYS_CLK should be available to all scan register circuits before the second SYS_CLK pulse. Furthermore, the D-STRB register should not be along the scan path since otherwise its value would be subject to change during scan operations, and this would cause the master latch circuit to lose its data. FIG. 10B illustrates how D_STRB may be implemented using a flip-flop circuit. In this way, the first SYS_CLK pulse allows the slave-latch 12B sections of scan-registers 14A, 14B, 14C, etc., to be updated from the predetermined values present in their respective master-latch sections 12A. The setting of D_STRB to logic low before the second SYS_CLK pulse permits the register to be updated with its normal system input SYS_DATA on the second rising edge of SYS_CLK.

It is possible to repeat a given experiment several times by gradually reducing the time between the first and second SYS_CLK pulses until these become so closely spaced that the digital system's combinational logic does not have sufficient time, before the second SYS_CLK pulse arrives, to respond properly to the values set at the slave-latch 12B circuit outputs q_out with the first SYS_CLK pulse. The failure point provides a measurement of the propagational delay through the combinational circuit.

FIG. 6 depicts an alternative embodiment 16 of the scan-register with master-load circuit 14. This embodiment is referred to as "scan-register with master-load and double inversion." In the circuit of FIG. 6, the inverting output QN of latch circuits 12A' and 12B' is used in place of the non inverting Q output and the scan-register 16 output SCAN_OUT is obtained from the Q output of slave-latch 12B'. The effect of this interchange of signals is that every data transfer from master-latch 12A' or scan-latch 10A' to slave-latch 12B', as well as from the scan-register 16 input SYS_DATA or scan-in to the master latch 12A' results in inversion of data polarity. This does not affect data transfers from the scan register 16 input SYS_DATA to scan register 16 output Q-OUT since it involves an even number of inversions, which cancel each other out. Scan register 16 output SCAN_OUT always stores the complement of scan register 16 output Q_OUT. Data transfers from the scan register 16 input SCAN_IN to the scan register 16 output SCAN_OUT involves inversion of data polarity only if the said transfer is achieved by going through master-latch 12A'.

The circuit of FIG. 6 has an important feature not present in the circuit of FIG. 4 since data which is latched into master-latch 12A' of FIG. 6 (and saved there by setting D_STRB high) is inverted when it is later moved into slave-latch 12B'. It is possible to initially set the master-latch 12A' and slave-latch 12B' Q outputs to the same value. It is seen that Q_OUT is initially set to the Q value, and then changes to the complement of the Q value when SYS_CLK transitions from low to high. Therefore, if scan in is performed with D-STRB and M-LOAD set high, all scan-registers would be set to contain the same value in their master-latch 12A' as in their slave-latch 12B' such that dropping M_LOAD to low and then applying two consecutive SYS_CLK pulses and allowing D_STRB to change between rising edges would force all of the Q_OUT signals to change to the opposite state. In many instances, this would be the desired effect as it allows creating signal transitions whose effects on the combinational circuitry of the chip can be captured by a subsequent SYS_CLK pulse. Delay path testing could be performed without the need for a second scan in action before the two SYS_CLK pulses are applied.

Figure 7:
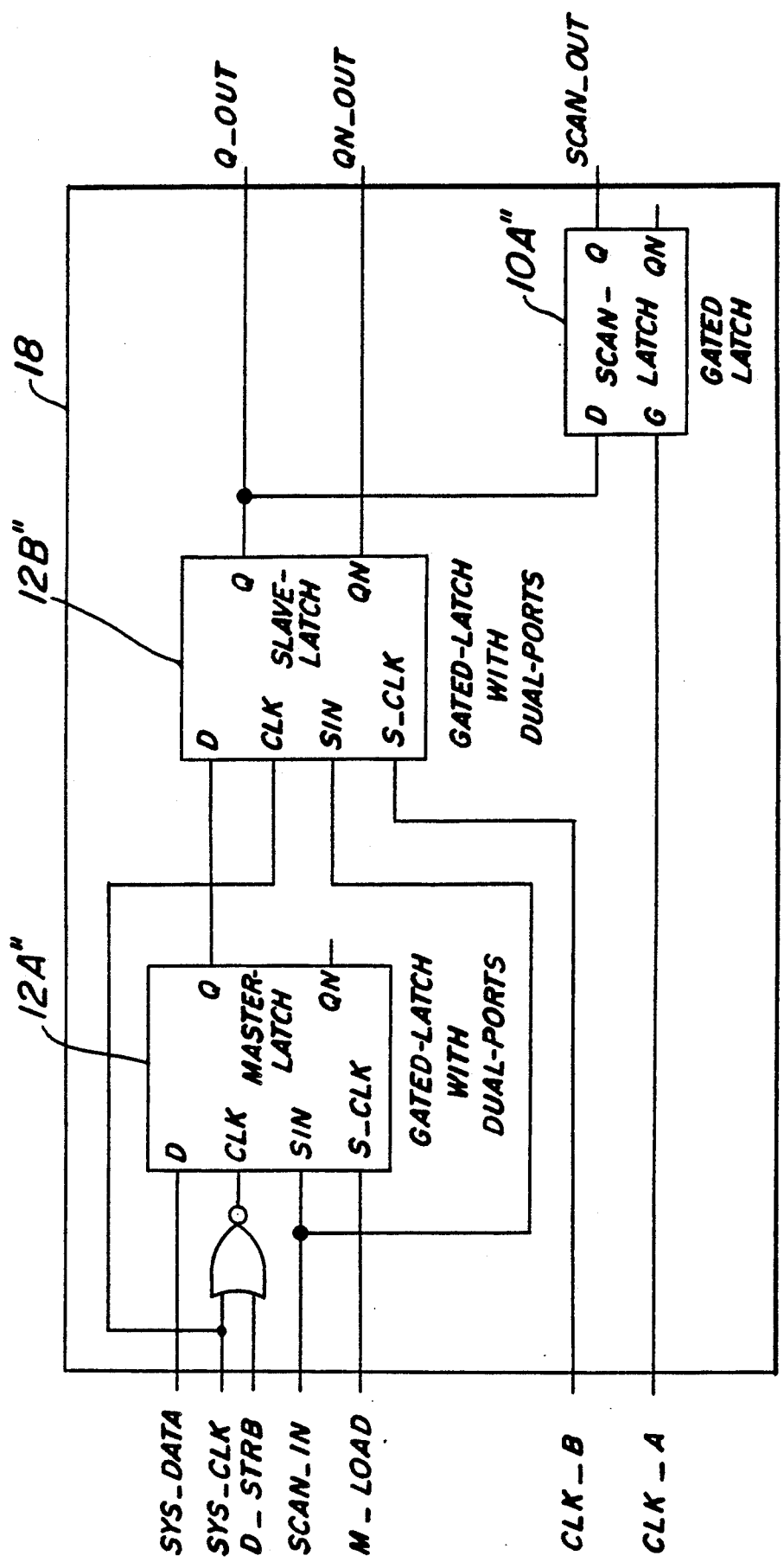
FIGS. 7 and 8 are block diagrams of alternative embodiments of the circuits of FIGS. 4 and 6, respectively.
Figure 8:
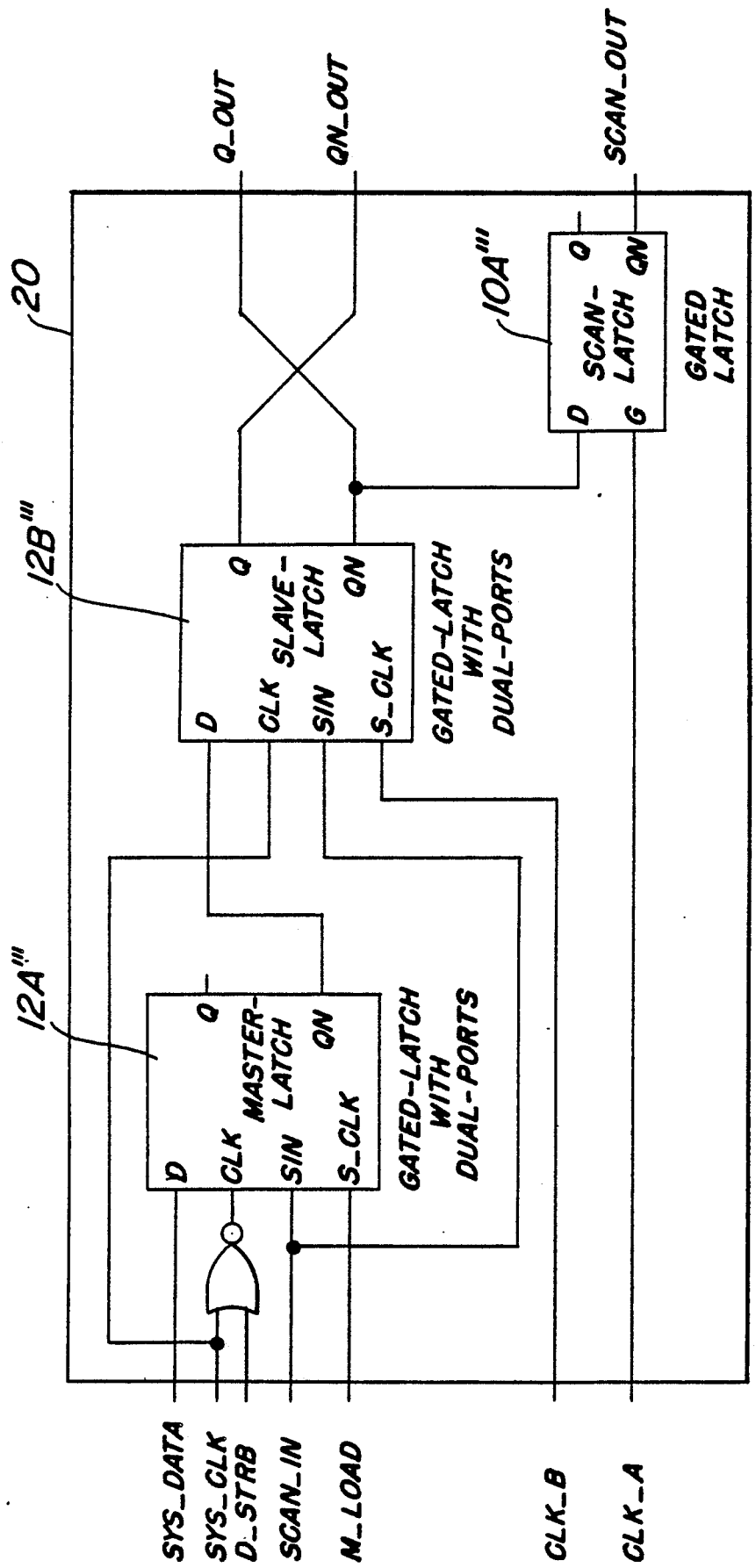

FIGS. 7 and 8 show additional alternative embodiments of the invention that operate in a manner similar to the circuits of FIGS. 4 and 6, respectively. The embodiments of FIGS. 7 and 8 differ from their counterparts depicted in FIGS. 4 and 6 by the interconnections among master-latch 12A", slave-latch 12B", and the scan-latch 10A". In FIG. 7, the master-latch/slave-latch pair is interconnected in a similar fashion to the ordinary master-slave register depicted in FIG. 4. A separate scan-latch 10A" is driven from the slave-latch 12B" Q terminal.

The circuit of FIG. 8 is similar to the circuit of FIG. 7, with the exception that the inverting output QN of each latch 12A''', 12B''', 10A'''' is used in place of its non-inverting Q output. This produces the same effect as discussed above with reference to the circuit of FIG. 6.

The operation of the embodiments of FIGS. 7 and 8 will now be summarized with reference to FIG. 7. (As with FIGS. 4 and 6, any differences between the operations of the embodiments of FIG. 7 and 8 will be readily apparent.)

Again, there are two modes of operation. The first mode of operation is selected in accordance with a first predefined sequence of the predefined states of the control signals SYS_CLK and M_LOAD. Data is sequentially shifted from either the SYS_DATA or SCAN_IN input ports, through master latch 12A" and slave latch 12B" to the Q_OUT data output port. This data is also available to scan latch 10A" for storage and presentation at the SCAN_OUT data output port.

According to the first mode of operation, data is shifted from the SYS_DATA input port to the Q_OUT output port in response to sequential occurrences of rising edges of the SYS_CLK signal. In addition, data is shifted from the SCAN_IN port to the Q_OUT port in response to a high going pulse of the M_LOAD signal followed by a high going pulse of the SYS_CLK signal.

The second mode of operation is selected in accordance with a second predefined sequence of the predefined states of the control signals. According to this mode, data is shifted from the SCAN_IN port, directly through only slave latch 12B" and scan-latch 10A" to the Q_OUT and SCAN_OUT output ports in response to a high going pulse of the CLK_B signal followed by a high going pulse of the CLK_A signal.

It should be noted that the NOR gate associated with the master latch 12, 12A', 12A" in the various embodiments may be considered as part of the master latch in the invention defined by the appended claims, but the claims are by no means limited in scope to use of a master latch having the illustrated NOR gate or NOR function, except as may be expressly set forth in the claims.

Figure 9A:
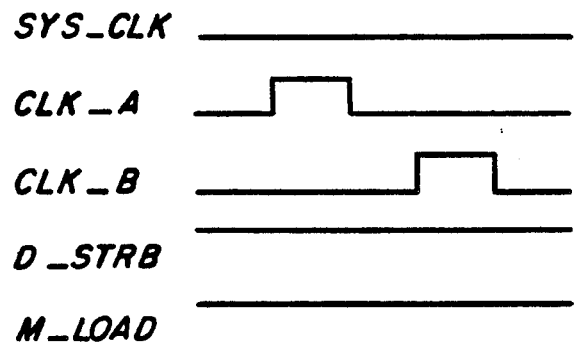
FIGS. 9(A)–(C) are timing diagrams for the circuit of FIG. 8.
Figure 9B:
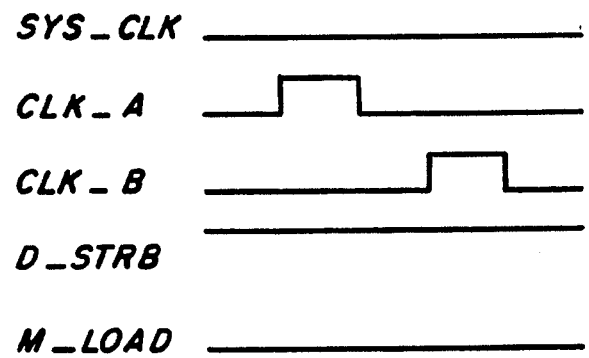
Figure 9C:
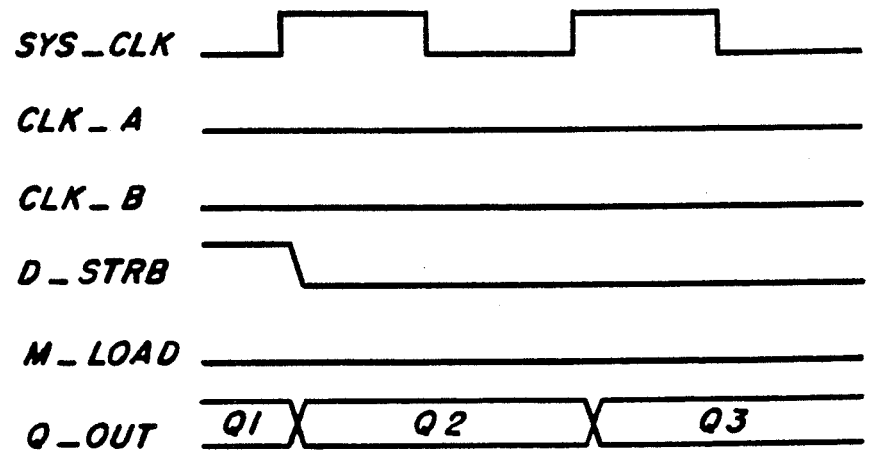

FIG. 9 depicts timing diagrams for the test signals CLK_A, CLK_B, M_LOAD and D_STRB. Q1 represents the value that was scanned into slave-latch 12B''', Q2 the value that was scanned into master-latch 12A''', and Q3 the system input data captured into the register 20.

FIG. 10 shows a particular CMOS implementation of the scan-register with master-load and double inversion 20 which also incorporates an ENABLE function. FIGS. 10A, 10B, 10C and 10D illustrate how the various control signals used in FIG. 10 are derived. The table of FIG. 11 presents a tabular description of the behavior of the register depicted in FIG. 8.

Many changes, modifications and variations of the preferred embodiments will become apparent to those skilled in the art after considering this specification and accompanying drawings. All such changes, modifications and variations within the spirit and scope of the invention are deemed to be covered by the invention, which is limited only by the following claims.

We claim:

1. A scan-register having at least first and second data input ports, at least one data output port, and inputs for at least first, second, third, and fourth control signals, comprising:
    (a) first means having inputs coupled to the first and second data input ports for selectively storing data appearing on one of the said data input ports in accordance with the occurrence of a predefined combination of states of at least the first and second control signals;
    (b) second means having at least one input coupled to the second data input port for selectively storing data appearing on the second data input port in accordance with the occurrence of a predefined state of at least the third control signal; and,
    (c) third means having at least one input port coupled to an output of at least one of the first and second means, and further having an output coupled to the data output port, for selectively storing data stored in one of the first and second means in accordance with the occurrence of a predefined state of at least the fourth control signal and providing the data stored therein to the data output port;
    the data appearing on one of the first and second data input ports being sequentially shiftable through selected ones of the first, second and third means, to the output port in accordance with the occurrence of predefined sequences of the predefined states of at least selected ones of the control signals.

2. Scan register according to claim 1 further comprising a disable input coupled to the first means for disabling the first means from responding to the occurrence of the first control signal.

3. Scan register according to claim 1 wherein the third means has a pair of inputs, a first one of the inputs of the third means being coupled to an output of the first means, a second one of the inputs of the third means being coupled to an output of the second means, the third means storing the data stored in the first means in accordance with the occurrence of a predefined state of the first control signal and storing the data stored in the second means in accordance with the occurrence of a predefined state of the fourth control signal.

4. Scan register according to claim 1 or 3 wherein, in a first mode of operation selected in accordance with a first predefined sequence of predefined states of the control signals, data is sequentially shiftable from one of the first and second data input ports, through the first and third means to the output data port while different data is stored in the second means, and in a second mode of operation selected in accordance with a second predefined sequence of predefined states of the control signals, data is sequentially shiftable from the second data input port, through the second and third means to the output data port while different data is stored in the first means.

5. Scan register according to claim 4 wherein data is shifted from the first data input port to the data output port in response to sequential occurrences of the predefined states of the first control signal and wherein data is shifted from the second data input port to the data output port in response to the occurrence of the predefined state of the second control signal followed by the occurrence of the predefined state of the first control signal.

6. Scan register according to claim 5 wherein data is shifted from the second data input port, directly through only the second means and third means to the data output port in response to the occurrence of the predefined state of the third control signal followed by the occurrence of the predefined state of the fourth control signal.

7. Scan-register according to claim 1 wherein the scan-register comprises first and second data output ports and wherein the second means has a pair of inputs, a first one of the inputs of the second means being coupled to an output of the first means, a second one of the inputs of the second means being coupled to the second data input port, an output of the second means being coupled to the first data output port, and further wherein the third means has an input coupled to an output of the second means and an output coupled to the second data output port, the third means storing data provided at the output of the second means in accordance with the occurrence of the fourth control signal.

8. Scan-register according to claim 7 wherein, in a first mode of operation selected in accordance with a first predefined sequence of the predefined states of the control signals, data is sequentially shiftable from one of the first and second input ports, through the first and second means to the first data output port and to the third means for storage in the third means and presentation at the second data output port, and wherein, in a second mode of operation selected in accordance with a second predefined sequence of the predefined states of the control signals, data is sequentially shiftable from one of the first and second data input ports, through only the first and second means to only the first data output port, while different data is stored in the third means.

9. Scan-register according to claim 8 wherein data is shifted from the first data input port to the first data output port in response to sequential occurrences of the predefined states of the first control signal, and wherein data is shifted from the second data input port to the first data output port in response to the occurrence of the predefined state of the second control signal followed by the occurrence of the predefined state of the first control signal.

10. Scan-register according to claim 9 wherein data is shifted from the second data input port, directly through only the second means and third means to the first and second data output ports in response to the occurrence of the predefined state of the third control signal followed by the occurrence of the predefined state of the fourth control signal.

11. Scan-register according to claim 1 wherein the first means comprises a dual input port, dual clock latch circuit.

12. Scan-register according to claim 11 wherein the second means comprises a single data input, single clock input latch circuit and the third means comprises a dual data input, dual clock input latch circuit.

13. Scan-register according to claim 11 wherein the second means comprises a dual data input, dual clock input latch circuit and the third means comprises a single data input, single clock input latch circuit.

14. Scan-register of claim 1 wherein the first means comprises a master latch, the second means comprises a scanlatch, and the third means comprises a slave latch;
the master latch comprising:
(a) first and second input terminals to which a first data signal appearing on the first data input port (SYS_DATA) and the first control signal (SYS_CLK) are applied, respectively;
(b) third and fourth input terminals to which a second data signal appearing on the second data input port (SCAN_IN) and the second control signal (M_LOAD) are applied, respectively;
(c) means for selectively storing data values ($Q_m$) representative of the data signals SYS_DATA and SCAN_IN, the selection being in accordance with at least the occurrence of the predefined combination of states of the first and second control signals; and
(d) first and second output terminals from which the stored data value $Q_m$ and its complement ($QN_m$) are readable, respectively;
the scan-latch comprising:
(e) first and second input terminals to which the SCAN_IN data signal and the third control signal (CLK_B) are applied, respectively;
(f) means for storing data values ($Q_{sc}$) representative of the SCAN_IN data signal; and
(g) first and second output terminals from which the stored data value $Q_{sc}$ and its complement ($QN_{sc}$) are readable, respectively; and
the slave latch comprising:
(h) a first terminal coupled to one of the output terminals of the master latch and a second input terminal coupled to receive the SYS_CLK signal;
(i) a third input terminal coupled to one of the output terminals of the scan-latch and a fourth input terminal coupled to receive the fourth control signal (CLK_A);

(j) means for selectively storing data values ($Q_{s1}$) representative of the data signals appearing on the first and third input terminals of the slave latch, the selection being in accordance with the occurrence of a predefined combination of states of at least the control signals SYS_CLK and CLK_A appearing on the second and fourth input terminals of the slave latch respectively; and (k) first and second output terminals from which the stored data value $Q_{s1}$ and its complement ($QN_{s1}$) are readable, respectively.

15. Scan-register of claim 1 wherein the first means comprises a master latch, the second means comprises a slave latch, and the third means comprises a scan-latch; the master latch comprising:

(a) first and second input terminals to which a first data signal appearing on the first data input port (SYS_DATA) and the first control signal (SYS_CLK) are applied, respectively;

(b) third and fourth input terminals to which a second data signal appearing on the second data input port (SCAN_IN) and the second control signal (M_LOAD) are applied, respectively;

(c) means for selectively storing data values ($Q_m$) representative of the data signals SYS_DATA and SCAN_IN, the selection being in accordance with at least the occurrence of the predefined combination of states of the first and second control signals; and (d) first and second output terminals from which the stored data value $Q_m$ and its complement ($QN_m$) are readable, respectively;

the scan-latch comprising:

(e) first and second input terminals to which data signal appearing on the output data port (Q_OUT) and third control signal (CLK_A) are applied, respectively;

(f) means for storing data values ($Q_{sc}$) representative of the data signals appearing on the first input terminal; and (g) first and second output terminals from which the stored data value $Q_{sc}$ and its complement ($QN_{sc}$) are readable, respectively; and the slave latch comprising:

(h) a first input terminal coupled to one of the output terminals of the master latch and a second input terminal coupled to receive the SYS_CLK signal;

(i) a third input terminal coupled to receive the SCAN_IN signal and a fourth input terminal coupled to receive the fourth control signal (CLK_B);

(j) means for selectively storing data values ($Q_{s1}$) representative of the data signals appearing on the first and third input terminals of the slave latch, the selection being in accordance with at least the occurrence of a predefined combination of states of the control signals SYS_CLK and CLK_A appearing on the second and fourth input terminals of the slave latch, respectively; and (k) first and second output terminals from which the stored data value $Q_{s1}$ and its complement ($QN_{s1}$) are readable, respectively.

16. A scan-register having at least first and second data input ports, at least one data output port, and inputs for at least first, second, third and fourth control signals, comprising:

(a) master latch means comprising a gated-latch with dual data inputs coupled to the first and second data input ports, for selectively storing data appearing on one of the said data input ports in accordance with the occurrence of a predefined combination of states of at least the first and second control signals;

(b) first latch means having at least one input coupled to the second data input port, for selectively storing data appearing on the second data input port in accordance with at least the occurrence of a predefined state of the third control signal; and, (c) second latch means having at least one input coupled to an output of at least one of the master latch means and the first latch means, and further having an output coupled to the data output port, for selectively storing data stored in one of the master latch means and the first latch means in accordance with the occurrence of a predefined state of at least the fourth control signal and providing the data stored therein to the data output port;

the data appearing on one of the first and second data input ports being sequentially shiftable through selected ones of the master, first and second latch means, and to the output port in accordance with the occurrence of predefined sequences of the predefined states of at least selected ones of the control signals while storing different data in a non selected one of the master, first and second latch means.

17. Scan register according to claim 16 wherein the second latch means has a pair of inputs, a first one of the inputs of the second latch means being coupled to an output of the master latch means, a second one of the inputs of the second latch means being coupled to an output of the first latch means, the second latch means storing the data stored in only the master latch means in accordance with the occurrence of a predefined state of the first control signal and storing the data stored in only the first latch means in accordance with the occurrence of a predefined state of the fourth control signal, the scan-register being operable in a first mode of operation selected in accordance with a first predefined sequence of predefined states of the control signals, wherein the data is sequentially shiftable from one of the first and second data input ports, through the master latch and second latch means to the output data port while different data is stored in the first latch means, and operable in a second mode of operation selected in accordance with a second predefined sequence of predefined states of the control signals, wherein data is sequentially shiftable from the second data input port, through the first and second latch means to the output data port while different data is stored in the master latch means.

18. Scan register according to claim 17 wherein (i) data is shifted from the first data input port to the data output port in response to sequential occurrences of the predefined states of the first control signal; (ii) data is shifted from the second data input port to the data output port in response to the occurrence of the predefined state of the second control signal followed by the occurrence of the predefined state of the first control signal; and (iii) data is shifted from the second data input port, directly through only the first latch means and second latch means to the data output port in response to the occurrence of the predefined state of the third control signal followed by the occurrence of the predefined state of the fourth control signal.

19. Scan-register according to claim 16 wherein the scan-register comprises first and second data output ports and wherein the first latch means has a pair of inputs, a first one of the inputs of the first latch means being coupled to an output of the master latch means, a second one of the inputs of the first latch means being coupled to the second data input port, an output of the first latch means being coupled to the first data output port, the first latch means storing the data stored in only the master latch means in accordance with the occurrence of the predefined state of the first control signal and storing data appearing on only the second data input port in accordance with the occurrence of the predefined state of the third control signal, and further wherein the second latch means has an input coupled to an output of the first latch means and an output coupled to the second data output port, the second latch means storing data provided at the output of the first latch means in accordance with the occurrence of the fourth control signal.

20. Scan-register according to claim 19 wherein, in a first mode of operation selected in accordance with a first predefined sequence of the predefined states of the control signals, data is sequentially shiftable from one of the first and second input ports, through the master latch and first latch means to the first data output port and to the second latch means for storage in the second latch means and presentation at the second data output port, and wherein, in a second mode of operation selected in accordance with a second predefined sequence of the predefined states of the control signals, data is sequentially shiftable from one of the first and second data input ports, through only the master latch and first latch means to only the first data output port, while different data is stored in the second latch means.

21. Scan-register according to claim 20 wherein (i) data is shifted from the first data input port to the first data output port in response to sequential occurrences of the predefined states of the first control signal; (ii) data is shifted from the second data input port to the first data output port in response to either (a) the occurrence of the predefined state of the third control signal or (b) the occurrence of the predefined state of second control signal followed by the occurrence of the predefined state of the first control signal; and (iii) data is shifted from the second data input port, directly through only the first latch means and second latch means to at least the second data output port in response to the occurrence of the predefined state of the third control signal followed by the occurrence of the predefined state of the fourth control signal.

22. A scan-register having at least first and second data input ports, at least one data output port, and inputs for at least first, second, third and fourth control signals, comprising:
(a) master latch means comprising a gated-latch with dual data inputs coupled to the first and second data input ports, for selectively storing data appearing on one of the said data input ports in accordance with the occurrence of a predefined combination of states of at least the first and second control signals;
(b) scan-latch means having at least one input coupled to the second data input port, for selectively storing data appearing on the second data input port in accordance with at least the occurrence of a predefined state of the third control signal;
(c) slave latch means comprising a gated-latch with dual data inputs, a first one of the inputs of the slave latch means being coupled to an output of the master latch means, a second one of the inputs of the slave latch means being coupled to an output of the scan latch means, the slave latch means storing the data stored in only the master latch means in accordance with the occurrence of a predefined state of the first control signal and storing the data stored in only the scan latch means in accordance with the occurrence of a predefined state of the fourth control signal; and
(d) disable means coupled to the master latch means for disabling the master latch means from responding to the occurrence of the first control signal;
wherein, in a first mode of operation selected in accordance with a first predefined sequence of predefined states of the control signals, data is sequentially shiftable from one of the first and second data input ports, through the master latch and slave latch means to the output data port while different data is stored in the scan latch means, and in a second mode of operation selected in accordance with a second predefined sequence of predefined states of the control signals, data is sequentially shiftable from the second data input port, through the scan and slave latch means to the output data port while different data is stored in the master latch means.

23. Scan register according to claim 22 wherein (i) data is shifted from the first data input port to the data output port in response to sequential occurrences of the predefined states of the first control signal; (ii) data is shifted from the second data input port to the data output port in response to the occurrence of the predefined state of the second control signal followed by the occurrence of the predefined state of the first control signal; and (iii) data is shifted from the second data input port, directly through only the scan-latch means and slave latch means to the data output port in response to the occurrence of the predefined state of the third control signal followed by the occurrence of the predefined state of the fourth control signal.

24. A scan-register having at least first and second data input ports, at least one data output port, and inputs for at least first, second, third and fourth control signals, comprising:
(a) master latch means comprising a gated-latch with dual data inputs coupled to the first and second data input ports, for selectively storing data appearing on one of the said data input ports in accordance with the occurrence of a predefined combination of states of a least the first and second control signals;
(b) slave latch means comprising a gated-latch with dual data inputs, a first one of the inputs of the slave latch means being coupled to an output of the master latch means, a second one of the inputs of the slave latch means being coupled to the second data input port, an output of the slave latch means being coupled to the first data output port, the slave latch means storing the data stored in only the master latch means in accordance with the occurrence of a predefined state of the first control signal and storing the data appearing on the second data input port in accordance with the occurrence of a predefined state of the third control signal;
(c) scan-latch means having at least one input coupled to an output of the slave latch means, for selectively storing data appearing on the first output port in accordance with at least the occurrence of a predefined state of the fourth control signal; and (d) disable means coupled to the master latch means for disabling the master latch means from responding to the occurrence of the first control signal;

wherein, in a first mode of operation selected in accordance with a first predefined sequence of the predefined states of the control signals, data is sequentially shiftable from one of the first and second input ports, through the master latch and slave latch means to the first data output port and to the scan-latch means for storage in the scan-latch means and presentation at the second data output port, and wherein, in a second mode of operation selected in accordance with a second predefined sequence of the predefined states of the control signals, data is sequentially shiftable from one of the first and second data input ports, through only the master latch and slave latch means to only the first data output port, while different data is stored in the scan latch means.

25. Scan-register according to claim 24 wherein (i) data is shifted from the first data input port to the first data output port in response to sequential occurrences of the predefined states of the first control signal; (ii) data is shifted from the second data input port to the first data output port in response to either (a) the occurrence of the predefined state of the third control signal or (b) the occurrence of the predefined state of second control signal followed by the occurrence of the predefined state of the first control signal; and (iii) data is shifted from the second data input port, directly through only the slave latch means and scan-latch means to the second data output port in response to the occurrence of the predefined state of the third control signal followed by the occurrence of the predefined state of the fourth control signal.

26. Scan-register having at least two data input ports and at least one data output port, the scan-register comprising at least three interconnected latch circuits and at least four control signal inputs, at least two of the latch circuits being connected to a common input port for storing data appearing thereon, the latch circuits being responsive to the occurrence of at least one predefined sequence of predefined states of said at least four control signals to shift data from an input port to an output port via at least two selected latches while storing different data in a non-selected latch and thereafter being responsive to the occurrence of a predefined state of at least one of the control signals to shift the different data stored in the non-selected latch to the output port.

* * * * *